US012562352B2

(12) United States Patent
Yaegashi et al.

(10) Patent No.: US 12,562,352 B2
(45) Date of Patent: Feb. 24, 2026

(54) PREDICTION METHOD AND INFORMATION PROCESSING APPARATUS FOR PREDICTING THE PROCESS RESULT IN A PLASMA ETCHING PROCESS

(71) Applicant: Tokyo Electron Limited, Tokyo (JP)

(72) Inventors: Keita Yaegashi, Miyagi (JP); Joji Takayoshi, Miyagi (JP); Takayuki Suzuki, Miyagi (JP); Ryohei Takeda, Miyagi (JP); Soya Todo, Boise, ID (US); Yusuke Saitoh, Miyagi (JP); Takaharu Saino, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 426 days.

(21) Appl. No.: 18/122,469

(22) Filed: Mar. 16, 2023

(65) Prior Publication Data

US 2023/0298867 A1 Sep. 21, 2023

(30) Foreign Application Priority Data

Mar. 17, 2022 (JP) ................................. 2022-042143

(51) Int. Cl.
 *H05K 3/00* (2006.01)
 *G05B 19/4099* (2006.01)
 *H01J 37/32* (2006.01)
(52) U.S. Cl.
 CPC .... *H01J 37/32669* (2013.01); *G05B 19/4099* (2013.01); *G05B 2219/45031* (2013.01);
 (Continued)

(58) Field of Classification Search
 CPC ....... H01J 37/32669; H01J 2237/24564; H01J 2237/3343; H01J 37/32091;
 (Continued)

(56) References Cited

U.S. PATENT DOCUMENTS 8,296,687 B2 * 10/2012 Strang .............. G05B 19/41885
 716/51
2002/0055259 A1 * 5/2002 Balasubramhanya .......................
 G05B 23/024
 438/689

(Continued)

FOREIGN PATENT DOCUMENTS

JP 2001023963 A * 1/2001
JP 2006-507665 A 3/2006
JP 2015-201552 A 11/2015

OTHER PUBLICATIONS

Aoi Nobuo, English translation of JP-2001023963-A, 2001 (Year: 2001).*

*Primary Examiner* — Kamini S Shah
*Assistant Examiner* — Jonathan Michael Skrzycki
(74) *Attorney, Agent, or Firm* — XSENSUS LLP

(57) ABSTRACT

A prediction method includes a calculation process and a prediction process. The calculation process calculates a correlation between a spatial distribution value of a magnetic field in a chamber when a plasma etching process is performed on a substrate disposed in the chamber, and a process result of the plasma etching process on the substrate. The prediction process predicts the process result of the plasma etching process on the substrate from the spatial distribution value of the magnetic field in the chamber based on the calculated correlation.

12 Claims, 13 Drawing Sheets

(52) U.S. Cl.
CPC ................ *H01J 2237/24564* (2013.01); *H01J 2237/3343* (2013.01); *H05K 3/0041* (2013.01)

(58) Field of Classification Search
CPC ...... G05B 19/4099; G05B 2219/45031; G05B 2219/32194; G05B 19/41875; H05K 3/0041; H01L 22/20; H01L 21/3065; H01L 21/67069; H01L 22/12
See application file for complete search history.

(56) References Cited

U.S. PATENT DOCUMENTS

| | | | | |
|---|---|---|---|---|
| 2004/0056602 | A1* | 3/2004 | Yang ................... | H01J 37/3266 |
| | | | | 315/111.21 |
| 2006/0284812 | A1* | 12/2006 | Griswold ........... | G01R 33/5611 |
| | | | | 345/92 |
| 2019/0237309 | A1* | 8/2019 | Kamaji ............. | H01L 21/67253 |
| 2022/0223479 | A1* | 7/2022 | Shao ...................... | G01B 21/22 |

* cited by examiner

FIG. 12A

| SET CURRENT VALUE OF COIL | C1 | C2 | C3 | C4 | C5 |
|---|---|---|---|---|---|
| PROCESS CONDITION 1 | 3 | −2 | 2 | 1 | 6 |
| PROCESS CONDITION 2 | 2 | −1 | 1 | −1 | 3 |
| PROCESS CONDITION 3 | . | . | . | . | . |
| ... | . | . | . | . | . |
| ... | . | . | . | . | . |
| PROCESS CONDITION 20 | 1 | −3 | 3 | 0 | 9 |

FIG. 12B

| SPATIAL DISTRIBUTION OF MAGNETIC FIELD | SPATIAL POSITION 1 | SPATIAL POSITION 2 | ... | SPATIAL POSITION 3999 | SPATIAL POSITION 4000 |
|---|---|---|---|---|---|
| PROCESS CONDITION 1 | 0.1 | 0.3 | −0.4 | 0.1 | −0.9 |
| PROCESS CONDITION 2 | 0.2 | −0.2 | 3 | −0.9 | 0.3 |
| PROCESS CONDITION 3 | . | . | . | . | . |
| ... | . | . | . | . | . |
| ... | . | . | . | . | . |
| PROCESS CONDITION 20 | 0.1 | −0.3 | 0.3 | 0 | 0.9 |

FIG. 12C

| PRINCIPAL COMPONENT SCORE OF EACH PRINCIPAL COMPONENT OF MAGNETIC FIELD | FIRST PRINCIPAL COMPONENT | SECOND PRINCIPAL COMPONENT | THIRD PRINCIPAL COMPONENT | FOURTH PRINCIPAL COMPONENT | FIFTH PRINCIPAL COMPONENT |
|---|---|---|---|---|---|
| PROCESS CONDITION 1 | 0.32 | 0.53 | −0.23 | 0.21 | −0.77 |
| PROCESS CONDITION 2 | 0.24 | −0.24 | 0.4 | −0.81 | −0.69 |
| PROCESS CONDITION 3 | . | . | . | . | . |
| ... | . | . | . | . | . |
| ... | . | . | . | . | . |
| PROCESS CONDITION 20 | 0.23 | 0.12 | −0.65 | 0.34 | −0.76 |

FIG. 12D

| | SUBSTRATE POSITION 1 | SUBSTRATE POSITION 2 | ... | SUBSTRATE POSITION 25 | SUBSTRATE POSITION 26 |
|---|---|---|---|---|---|
| PROCESS CONDITION 1 | 233 | 234 | 246 | 287 | 281 |
| PROCESS CONDITION 2 | 225 | 245 | 287 | 263 | 323 |
| PROCESS CONDITION 3 | . | . | . | . | . |
| ... | . | . | . | . | . |
| ... | . | . | . | . | . |
| PROCESS CONDITION 20 | 221 | 231 | 243 | 214 | 342 |

FIG. 12E

| PRINCIPAL COMPONENT SCORE OF EACH PRINCIPAL COMPONENT OF ETCHING RATE | FIRST PRINCIPAL COMPONENT | SECOND PRINCIPAL COMPONENT | THIRD PRINCIPAL COMPONENT | FOURTH PRINCIPAL COMPONENT | FIFTH PRINCIPAL COMPONENT |
|---|---|---|---|---|---|
| PROCESS CONDITION 1 | 0.21 | 0.32 | −0.13 | 0.24 | −0.73 |
| PROCESS CONDITION 2 | −0.54 | 0.23 | −0.45 | 0.51 | 0.39 |
| PROCESS CONDITION 3 | . | . | . | . | . |
| ... | . | . | . | . | . |
| ... | . | . | . | . | . |
| PROCESS CONDITION 20 | 0.33 | 0.12 | −0.78 | −0.12 | 0.45 |

FIG. 12F

WHEN EACH PRINCIPAL COMPONENT OF MAGNETIC FIELD IS EXPLANATORY VARIABLE

| PRINCIPAL COMPONENT SCORE OF EACH PRINCIPAL COMPONENT OF MAGNETIC FIELD | FIRST PRINCIPAL COMPONENT | SECOND PRINCIPAL COMPONENT | THIRD PRINCIPAL COMPONENT | FOURTH PRINCIPAL COMPONENT | FIFTH PRINCIPAL COMPONENT |
|---|---|---|---|---|---|
| PROCESS CONDITION 1 | 0.32 | 0.53 | −0.23 | 0.21 | −0.77 |
| PROCESS CONDITION 2 | 0.24 | −0.24 | 0.4 | −0.81 | −0.69 |
| PROCESS CONDITION 3 | . | . | . | . | . |
| ... | . | . | . | . | . |
| ... | . | . | . | . | . |
| PROCESS CONDITION 20 | 0.23 | 0.12 | −0.65 | 0.34 | −0.76 |

GENERATE REGRESSION MODEL INDICATING CORRELATION IN WHICH EACH PRINCIPAL COMPONENT OF ETCHING RATE IS OBJECTIVE VARIABLE

| PRINCIPAL COMPONENT SCORE OF EACH PRINCIPAL COMPONENT OF ETCHING RATE | FIRST PRINCIPAL COMPONENT | SECOND PRINCIPAL COMPONENT | THIRD PRINCIPAL COMPONENT | FOURTH PRINCIPAL COMPONENT | FIFTH PRINCIPAL COMPONENT |
|---|---|---|---|---|---|
| PROCESS CONDITION 1 | 0.21 | 0.32 | −0.13 | 0.24 | −0.73 |
| PROCESS CONDITION 2 | −0.54 | 0.23 | −0.45 | 0.51 | 0.39 |
| PROCESS CONDITION 3 | . | . | . | . | . |
| ... | . | . | . | . | . |
| ... | . | . | . | . | . |
| PROCESS CONDITION 20 | 0.33 | 0.12 | −0.78 | −0.12 | 0.45 |

FIG. 14A

| SET CURRENT VALUE OF COIL | C1 | C2 | C3 | C4 | C5 |
|---|---|---|---|---|---|
| PREDICTION CONDITION | 1 | 2 | 3 | 4 | 1 |

FIG. 14B

| SPATIAL DISTRIBUTION OF MAGNETIC FIELD | SPATIAL POSITION 1 | SPATIAL POSITION 2 | ... | SPATIAL POSITION 3999 | SPATIAL POSITION 4000 |
|---|---|---|---|---|---|
| PREDICTION CONDITION | 0.1 | 0.3 | −0.4 | 0.1 | −0.9 |

FIG. 14C

| PRINCIPAL COMPONENT SCORE OF EACH PRINCIPAL COMPONENT OF MAGNETIC FIELD | FIRST PRINCIPAL COMPONENT | SECOND PRINCIPAL COMPONENT | THIRD PRINCIPAL COMPONENT | FOURTH PRINCIPAL COMPONENT | FIFTH PRINCIPAL COMPONENT |
|---|---|---|---|---|---|
| PREDICTION CONDITION | 0.32 | 0.53 | −0.23 | 0.21 | −0.77 |

FIG. 14D

| PRINCIPAL COMPONENT SCORE OF EACH PRINCIPAL COMPONENT OF MAGNETIC FIELD | FIRST PRINCIPAL COMPONENT | SECOND PRINCIPAL COMPONENT | THIRD PRINCIPAL COMPONENT | FOURTH PRINCIPAL COMPONENT | FIFTH PRINCIPAL COMPONENT |
|---|---|---|---|---|---|
| PREDICTION CONDITION | 0.11 | 0.22 | −0.03 | 0.14 | −0.63 |

FIG. 14E

| PROCESS RESULT | SUBSTRATE POSITION 1 | SUBSTRATE POSITION 2 | ... | SUBSTRATE POSITION 25 | SUBSTRATE POSITION 26 |
|---|---|---|---|---|---|
| PREDICTION CONDITION | 223 | 214 | ... | 277 | 271 |

FIG. 16

| | EXPLANATORY VARIABLE | | |
| --- | --- | --- | --- |
| | SET CURRENT VALUE | MAGNETIC FIELD | PRINCIPAL COMPONENT OF MAGNETIC FIELD |
| ETCHING RATE | 1.16467066 | 1 | 1 |
| PRINCIPAL COMPONENT OF ETCHING RATE | 1.16167665 | 1.00598802 | 1.00598802 |

OBJECTIVE VARIABLE

PREDICTION METHOD AND INFORMATION PROCESSING APPARATUS FOR PREDICTING THE PROCESS RESULT IN A PLASMA ETCHING PROCESS

CROSS-REFERENCE TO RELATED APPLICATIONS

This application is based on and claims priority from Japanese Patent Application No. 2022-042143, filed on Mar. 17, 2022, with the Japan Patent Office, the disclosure of which is incorporated herein in its entirety by reference, and priority is claimed as to each of the foregoing.

TECHNICAL FIELD

The present disclosure relates to a prediction method and an information processing apparatus.

BACKGROUND

Japanese Patent Laid-Open Publication No. 2015-201552 discloses a technology that electrically conducts a plurality of annular coils provided at an upper portion of a processing container such that the coils function as electromagnets and generate a magnetic field, thereby controlling the gradient of the interface between the ion sheath of plasma generated in the processing container and a bulk plasma.

SUMMARY

According to an aspect of the present disclosure, a prediction method includes a calculation process and a prediction process. The calculation process calculates a correlation between a spatial distribution value of a magnetic field in a chamber when a plasma etching process is performed on a substrate disposed in the chamber, and a process result of the plasma etching process on the substrate. The prediction process predicts the process result of the plasma etching process on the substrate from the spatial distribution value of the magnetic field in the chamber based on the calculated correlation.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 12A is a view illustrating an example of data used for the calculation process according to an embodiment.

FIG. 12B is a view illustrating an example of data used for the calculation process according to an embodiment.

FIG. 12C is a view illustrating an example of data used for the calculation process according to an embodiment.

FIG. 12D is a view illustrating an example of data used for the calculation process according to an embodiment.

FIG. 12E is a view illustrating an example of data used for the calculation process according to an embodiment.

FIG. 12F is a view illustrating an example of data used for the calculation process according to an embodiment.

FIG. 14A is a view illustrating an example of data used for the prediction process according to an embodiment.

FIG. 14B is a view illustrating an example of data used for the prediction process according to an embodiment.

FIG. 14C is a view illustrating an example of data used for the prediction process according to an embodiment.

FIG. 14D is a view illustrating an example of data used for the prediction process according to an embodiment.

FIG. 14E is a view illustrating an example of data used for the prediction process according to an embodiment.

FIG. 16 is a view illustrating an example of a prediction error according to an embodiment.

DETAILED DESCRIPTION

In the following detailed description, reference is made to the accompanying drawings, which form a part hereof. The illustrative embodiments described in the detailed description, drawings, and claims are not meant to be limiting. Other embodiments may be utilized, and other changes may be made without departing from the spirit or scope of the subject matter presented here.

Hereinafter, embodiments of a prediction method and an information processing apparatus according to the present disclosure will be described in detail with reference to the drawings. The prediction method and the information processing apparatus described herein are not limited to the embodiments.

With the high integration and the miniaturization of semiconductor devices, the aspect ratio of patterns formed in semiconductor wafers has increased, which deepens the recesses of the patterns. For example, in a pillar process for fabricating 3D NAND, it is required that a hole having a high aspect ratio be etched vertically with plasma and contact a predetermined position of a lower layer. However, a phenomenon such as a tilting in which a hole obliquely progresses may occur. Such a tilting needs to be suppressed because it causes a failure of contact.

The tilting occurs when the incident direction of etching ions becomes oblique to the surface of a wafer. In a plasma etching process, the incident direction of etching ions may be adjusted to be perpendicular to the wafer surface, by making the interface between a bulk plasma and a sheath (hereinafter, referred to as a "sheath surface") parallel to the wafer surface. An effective method is known, which provides a plurality of annular coils at an upper portion of a processing container, electrically conducts the annular coils, controls a plasma density distribution by using a magnetic field generated by an electromagnet, and adjusts the sheath surface.

However, in the method of the related art, it is difficult to predict a process result of the plasma etching process. For example, in the method of the related art, the current supplied to the electromagnet is adjusted simply based on empirical rules, and there is a difficulty in precisely predicting how the tilting changes depending on the method of controlling the current supplied to the electromagnet. Thus, it has been expected to implement a technique of predicting a process result of a plasma etching process.

Embodiments

<Apparatus Configuration of Plasma Processing Apparatus>

Figure 1:
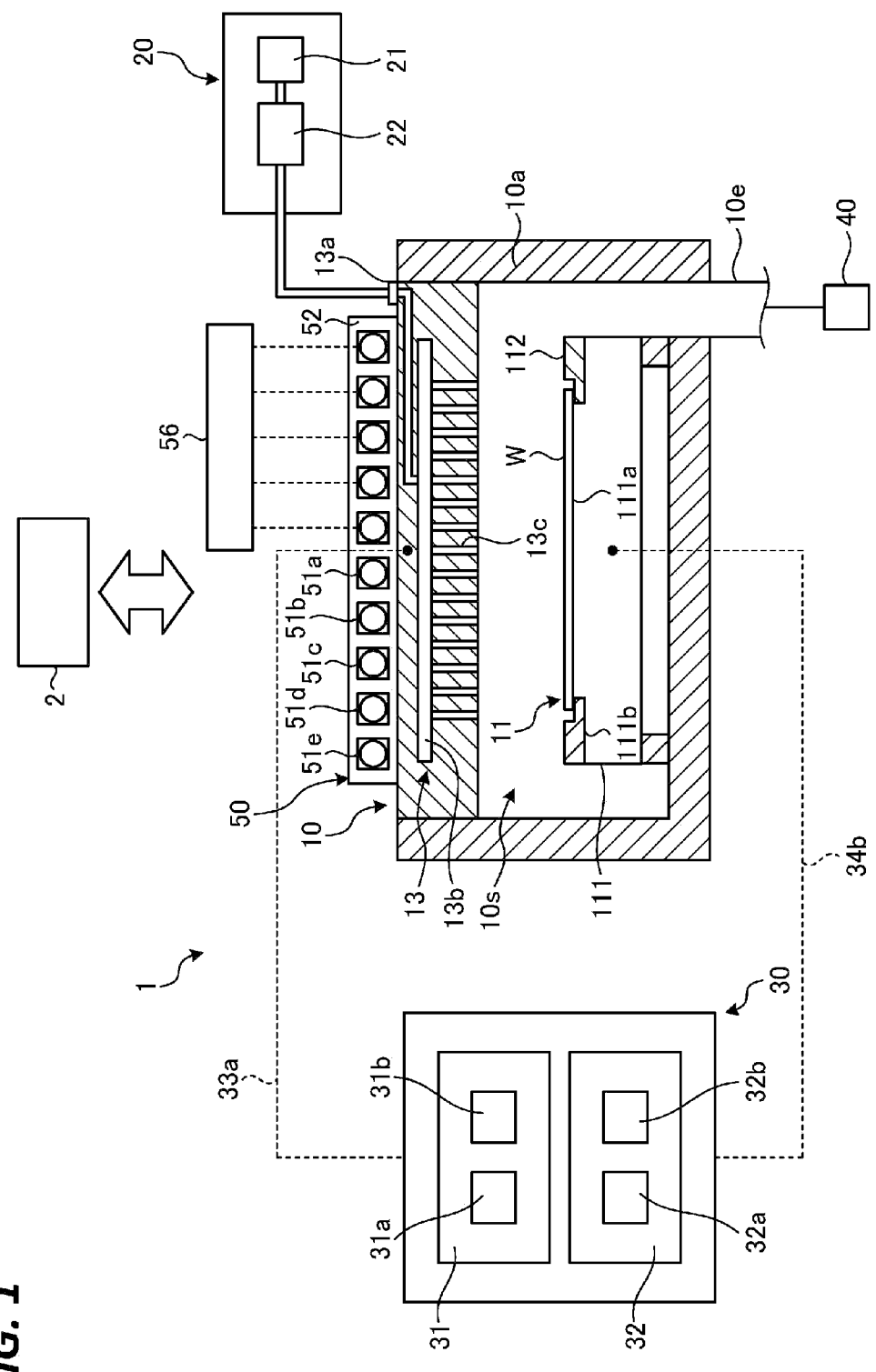
FIG. 1 is a view illustrating an example of a schematic configuration of a plasma processing system according to an embodiment.

First, an embodiment of a plasma processing apparatus that performs a plasma etching process will be described. In the embodiment described herein below, for example, it is assumed that the plasma processing apparatus is a plasma processing system having a system configuration. FIG. 1 is a view illustrating an example of a schematic configuration of the plasma processing system according to the embodiment.

Hereinafter, an example of the configuration of the plasma processing system will be described. The plasma processing system includes a capacitively-coupled plasma processing apparatus 1 and a control unit 2. The capacitively-coupled plasma processing apparatus 1 includes a plasma processing chamber 10, a gas supply unit 20, a power supply 30, and an exhaust system 40. Further, the plasma processing apparatus 1 includes a substrate support 11 and a gas introduction unit. The gas introduction unit is configured to introduce at least one processing gas into the plasma processing chamber 10. The gas introduction unit includes a shower head 13. The substrate support 11 is disposed inside the plasma processing chamber 10. The shower head 13 is disposed above the substrate support 11. In an embodiment, the shower head 13 makes up at least a portion of the ceiling of the plasma processing chamber 10. The plasma processing chamber 10 includes a plasma processing space 10s defined by the shower head 13, a side wall 10a of the plasma processing chamber 10, and the substrate support 11. The plasma processing chamber 10 includes at least one gas supply port for supplying at least one processing gas into the plasma processing space 10s, and at least one gas discharge port for discharging a gas from the plasma processing space. The side wall 10a is grounded. The shower head 13 and the substrate support 11 are electrically insulated from the housing of the plasma processing chamber 10.

The substrate support 11 includes a main body 111 and a ring assembly 112. The main body 111 has a central region (e.g., a substrate support surface) 111a for supporting a substrate (e.g., a wafer) W, and an annular region (e.g., a ring support surface) 111b for supporting the ring assembly 112. The annular region 111b of the main body 111 surrounds the central region 111a of the main body 111 in a plan view. The substrate W is disposed on the central region 111a of the main body 111, and the ring assembly 112 is disposed on the annular region 111b of the main body 111 to surround the substrate W disposed on the central region 111a of the main body 111. In an embodiment, the main body 111 includes a base and an electrostatic chuck. The base includes a conductive member. The conductive member of the base functions as a lower electrode. The electrostatic chuck is disposed on the base. The upper surface of the electrostatic chuck serves as the substrate support surface 111a. The ring assembly 112 includes one or more annular members. At least one of the one or more annular members is an edge ring. Further, although not illustrated, the substrate support 11 may include a temperature adjustment module configured to adjust at least one of the electrostatic chuck, the ring assembly 112, and the substrate to a target temperature. The temperature adjustment module may include a heater, a heat transfer medium, a flow path, or a combination thereof. A heat transfer fluid such as brine or a gas flows through the flow path. The substrate support 11 may include a heat transfer gas supply unit configured to supply a heat transfer gas to the space between the rear surface of the substrate W and the substrate support surface 111a.

The shower head 13 is configured to introduce at least one processing gas from the gas supply unit 20 into the plasma processing space 10s. The shower head 13 has at least one gas supply port 13a, at least one gas diffusion chamber 13b, and a plurality of gas introduction ports 13c. The processing gas supplied to the gas supply port 13a passes through the gas diffusion chamber 13b and is introduced into the plasma processing space 10s from the plurality of gas introduction ports 13c. Further, the shower head 13 includes a conductive member. The conductive member of the shower head 13 functions as an upper electrode. The gas introduction unit may include one or a plurality of side gas injectors (SGI) attached to one or a plurality of openings formed in the side wall 10a, in addition to the shower head 13.

The gas supply unit 20 may include one or more gas sources 21 and one or more flow rate controllers 22. In an embodiment, the gas supply unit 20 is configured to supply at least one processing gas from its corresponding gas source 21 to the shower head 13 via its corresponding flow rate controller 22. Each flow rate controller 22 may include, for example, a mass flow controller or a pressure-controlled flow rate controller. The gas supply unit 20 may further include one or more flow rate modulation devices that modulate or pulse the flow rate of at least one processing gas.

The power supply 30 includes an RF power supply 31 coupled to the plasma processing chamber 10 via at least one impedance matching circuit. The RF power supply 31 is configured to supply at least one RF signal (e.g., RF power) such as a source RF signal or a bias RF signal, to the conductive member of the substrate support 11 and/or the conductive member of the shower head 13. Thus, plasma is formed from at least one processing gas supplied into the plasma processing space 10s. Accordingly, the RF power supply 31 may function as at least a portion of a plasma generation unit configured to generate plasma from one or more processing gases in the plasma processing chamber 10. Further, by supplying the bias RF signal to the conductive member of the substrate support 11, a bias potential is generated in the substrate W, and ion components in the formed plasma may be drawn into the substrate W.

In an embodiment, the RF power supply 31 includes a first RF generation unit 31a and a second RF generation unit 31b.

The first RF generation unit 31a is coupled to the conductive member of the substrate support 11 and/or the conductive member of the shower head 13 via at least one impedance matching circuit, and is configured to generate a source RF signal (e.g., a source RF power) for plasma generation. In an embodiment, the source RF signal has a frequency in the range of 13 MHz to 150 MHz. In an embodiment, the first RF generation unit 31a may be configured to generate a plurality of source RF signals having different frequencies. The generated one or more source RF signals are supplied to the conductive member of the substrate support 11 and/or the conductive member of the shower head 13. The second RF generation unit 31b is coupled to the conductive member of the substrate support 11 via at least one impedance matching circuit, and is configured to generate a bias RF signal (e.g., a bias RF power). In an embodiment, the bias RF signal has a lower frequency than that of the source RF signal. In an embodiment, the bias RF signal has a frequency in the range of 400 kHz to 13.56 MHz. In an embodiment, the second RF generation unit 31b may be configured to generate a plurality of bias RF signals having different frequencies. The generated one or more bias RF signals are supplied to the conductive member of the substrate support 11. In various embodiments, at least one of the source RF signal and the bias RF signal may be pulsed.

The power supply 30 may further include a DC power supply 32 coupled to the plasma processing chamber 10. The DC power supply 32 includes a first DC generation unit 32a and a second DC generation unit 32b. In an embodiment, the first DC generation unit 32a is connected to the conductive member of the substrate support 11, and is configured to generate a first DC signal. The generated first bias DC signal is applied to the conductive member of the substrate support 11. In an embodiment, the first DC signal may be applied to another electrode such as an electrode of the electrostatic chuck. In an embodiment, the second DC generation unit 32b is connected to the conductive member of the shower head 13, and is configured to generate a second DC signal. The generated second DC signal is applied to the conductive member of the shower head 13. In various embodiments, at least one of the first and second DC signals may be pulsed. The first and second DC generation units 32a and 32b may be provided in addition to the RF power supply 31, and the first DC generation unit 32a may be provided in place of the second RF generation unit 31b.

The exhaust system 40 may be connected to a gas exhaust port 10e provided at, for example, the bottom of the plasma processing chamber 10. The exhaust system 40 may include a pressure regulating valve and a vacuum pump. The pressure in the plasma processing space 10s is regulated by the pressure regulating valve. The vacuum pump may include a turbo molecular pump, a dry pump, or a combination thereof.

An electromagnet 50 is disposed on the upper surface of the plasma processing chamber 10. The electromagnet 50 is disposed above the shower head 13. The electromagnet 50 includes a plurality of coils 51. The plurality of coils 51 are arranged concentrically.

Figure 2:
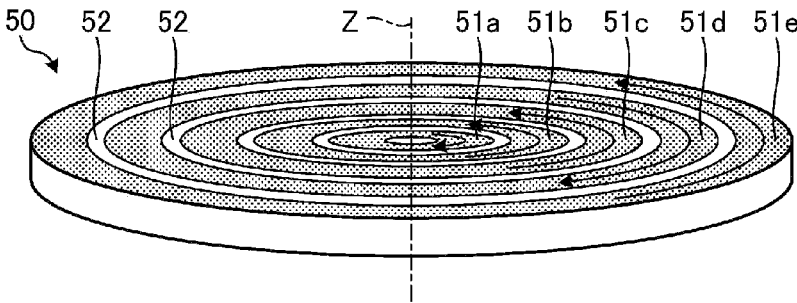
FIG. 2 is a view illustrating an example of a schematic configuration of an electromagnet according to an embodiment.

FIG. 2 is a view illustrating an example of a schematic configuration of the electromagnet 50 according to the embodiment. The electromagnet 50 according to the embodiment includes five coils 51 (51a, 51b, 51c, 51d, and 51e). The coils 51a, 51b, 51c, 51d, and 51e are each formed in an annular shape having a predetermined radius, and are arranged concentrically. The electromagnet 50 concentrically holds the coils 51a, 51b, 51c, 51d, and 51e by holding members 52 made of a soft magnetic material, and has an integrally formed structure. The electromagnet 50 is disposed such that a central axis Z of the plurality of coils 51 arranged concentrically is aligned with the center of the holding member 11. The electromagnet 50 generates a magnetic field when a current flows through the coils 51. FIG. 2 illustrates the direction of the current flowing through each coil 51 by an arrow.

Descriptions will be made referring back to FIG. 1. In the electromagnet 50, the outermost coil 51e is formed having a radius larger than the radius of the substrate W, and is disposed above the ring assembly 112 to cover even the outer side of the ring assembly 112. Further, the electromagnet 50 is disposed such that the innermost coil 51a is positioned above the center of the substrate W.

Both ends of each of the coils 51a, 51b, 51c, 51d, and 51e are electrically connected to an electromagnet excitation circuit 56. The electromagnet excitation circuit 56 may electrically conduct each of the coils 51a, 51b, 51c, 51d, and 51e with a current having an arbitrary current value under the control of the control unit 2. When a current flows through the coils 51a, 51b, 51c, 51d, and 51e, the electromagnet 50 may form a magnetic field in the plasma processing space 10s.

The control unit 2 is, for example, an information processing apparatus such as a computer. The control unit 2 controls each component of the plasma processing apparatus 1. The control unit 2 totally controls the operation of the plasma processing apparatus 1.

The control unit 2 controls a plasma etching process. For example, the control unit 2 controls the exhaust system 40 to exhaust the inside of the plasma processing chamber 10 to a predetermined degree of vacuum. The control unit 2 controls the gas supply unit 20 to introduce a processing gas from the gas supply unit 20 into the plasma processing space 10s. The control unit 2 controls the power supply 30 to supply a source RF signal and a bias RF signal from the first RF generation unit 31a and the second RF generation unit 31b in accordance with the introduction of the processing gas, thereby generating plasma in the plasma processing chamber 10 and performing the plasma etching process. During the plasma etching process, the control unit 2 controls the current value and the direction of the current supplied from the electromagnet excitation circuit 56 to the coils 51a, 51b, 51c, 51d, and 51e, so as to control the magnetic field formed in the plasma processing space 10s.

As described above, with the high integration and the miniaturization of semiconductor devices, the aspect ratio of patterns formed in the substrate W has increased, and the recesses of the patterns have become deeper. In the plasma processing apparatus 1, when the plasma etching process is performed on the substrate W, a tilting in which a hole is obliquely formed may occur in the substrate W.

Figure 3:
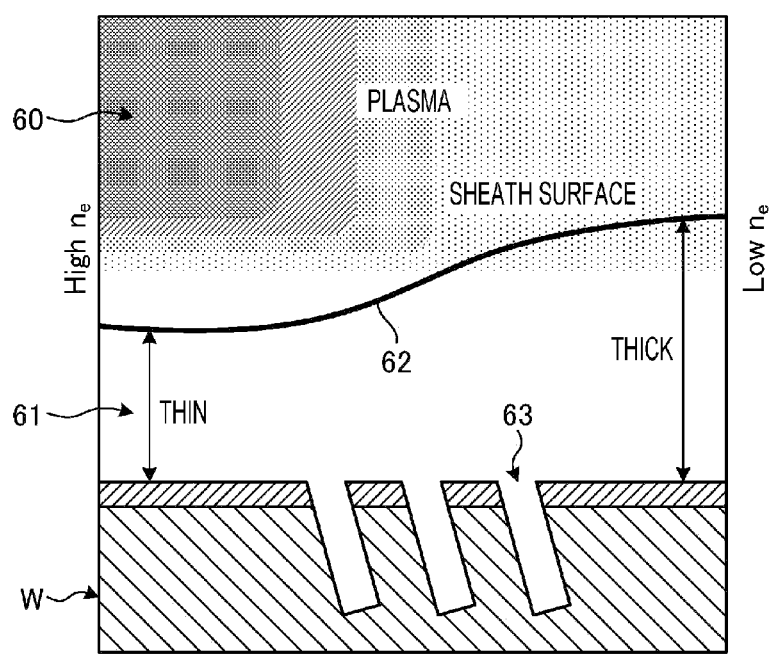
FIG. 3 is a view illustrating an example of a tilting according to an embodiment.

FIG. 3 is a view illustrating an example of the tilting according to the embodiment. FIG. 3 schematically illustrates the state of plasma when the plasma etching process is performed on the substrate W. FIG. 3 illustrates a plasma bulk region 60 having a high electron density $n_e$ and a sheath region 61 having a low electron density $n_e$. FIG. 3 also illustrates a sheath surface 62 which is a boundary surface between the bulk region 60 and the sheath region 61. Ions of the bulk region 60 are accelerated in the sheath region 61 and etch the substrate W. As illustrated in FIG. 3, when the sheath surface 62 becomes oblique to the substrate W, the incident direction of the ions becomes oblique to the substrate W, which causes a tilting in which a hole 63 obliquely progresses in the substrate W. The tilting occurs in the direction from the side where the thickness of the sheath region 61 is relatively thin toward the side where the thickness of the sheath region 61 is relatively thick. By making the sheath surface 62 parallel to the substrate W, the incident direction of the ions may be adjusted to be perpendicular to the substrate W.

The plasma processing apparatus 1 according to the embodiment may adjust the sheath surface 62 by electrically conducting the coils 51 of the electromagnet 50 provided on the plasma processing chamber 10, and controlling a plasma density distribution using the magnetic field generated by the electromagnet 50.

In the plasma processing apparatus 1 of the related art, the current supplied to each coil 51 of the electromagnet 50 is adjusted simply based on empirical rules, and it is difficult to precisely predict how the tilting changes depending on the control of the current supplied to each coil 51.

Thus, in the present embodiment, a correlation is calculated between spatial distribution values of magnetic fields in the plasma processing chamber 10 when the plasma etching process is performed by an information processing apparatus 200 to be described herein below, and a process result of the plasma etching process on the substrate W. Then, based on the calculated correlation, the information processing apparatus 200 predicts a process result of the plasma etching process.

[Apparatus Configuration of Information Processing Apparatus]

Figure 4:
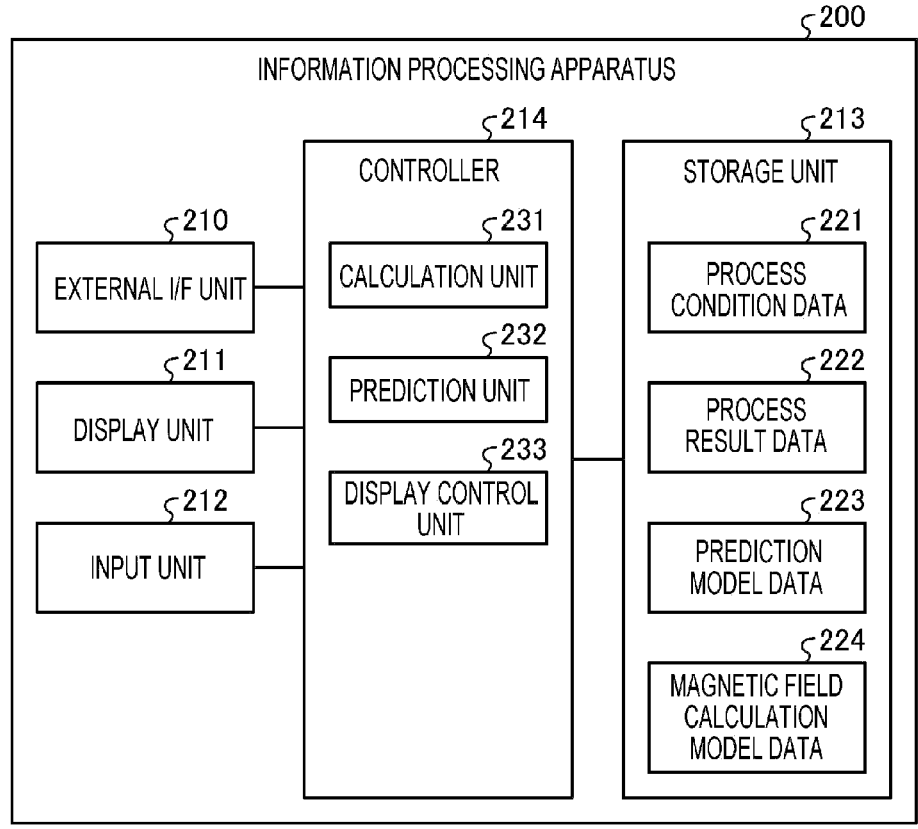
FIG. 4 is a view illustrating an example of a schematic configuration of an information processing apparatus according to an embodiment.

Next, an example of the information processing apparatus 200 according to the embodiment will be described. FIG. 4 is a view illustrating an example of a schematic configuration of the information processing apparatus 200 according to the embodiment. The information processing apparatus 200 is, for example, an information processing apparatus such as a computer. In the present embodiment, the information processing apparatus 200 corresponds to the information processing apparatus of the present disclosure.

The information processing apparatus 200 includes an external I/F (interface) unit 210, a display unit 211, an input unit 212, a storage unit 213, and a controller 214. The information processing apparatus 200 may include various functional units of known computers, in addition to the functional units illustrated in FIG. 4.

The external I/F unit 210 is an interface that inputs/outputs information with respect to another apparatus. For example, the external I/F unit 210 is an interface that controls a communication with another apparatus. As an aspect of the external I/F unit 210, a network interface card such as a LAN card may be adopted. For example, the external I/F unit 210 transmits/receives various data with respect to the plasma processing apparatus 1 or another information processing apparatus via a network. The external I/F unit 210 may be, for example, an interface such as a universal serial bus (USB) port.

The display unit 211 is a display device that displays various types of information. Examples of the display unit 211 may include display devices such as a liquid crystal display (LCD) and a cathode ray tube (CRT). The display unit 211 displays various types of information.

The input unit 212 is an input device that inputs various types of information. For example, the input unit 212 may be an input device such as a mouse or a keyboard. The input unit 212 receives an operation input from, for example, an administrator, and inputs operation information indicating received operation contents to the controller 214.

The storage unit 213 is a storage device that stores various data. For example, the storage unit 213 is a storage device such as a hard disk, a solid state drive (SSD), or an optical disk. The storage unit 213 may be a semiconductor memory in which data is rewritable, such as a random access memory (RAM), a flash memory, and a nonvolatile static random access memory (NVSRAM).

The storage unit 213 stores an operating system (OS) or various programs which are executed by the controller 214. For example, the storage unit 213 stores various programs including a prediction program for executing a calculation process or a prediction process to be described later. Further, the storage unit 213 stores various data, which are used in a program executed by the controller 214. For example, the storage unit 213 stores process condition data 221, process result data 222, prediction model data 223, and magnetic field calculation model data 224. The storage unit 213 may store other data as well, in addition to the data described above. The various programs or data may be programs or data stored in, for example, a computer-readable computer recording medium (e.g., a hard disk, an optical disk such as a DVD, a flexible disk, or a semiconductor memory). The various programs or data may be programs or data used online by being frequently transmitted from another apparatus.

The process condition data 221 are data that store process conditions for performing the plasma etching process. The process conditions include a current value of the current supplied to each coil 51 and a set current value indicating the flow direction of the current. The process result data 222 are data that store a process result of the plasma etching process for each process condition. The prediction model data 223 are data of a prediction model that predicts a process result of the plasma etching process. Details of the process condition data 221, the process result data 222, and the prediction model data 223 will be described later.

The magnetic field calculation model data 224 are data of a magnetic field calculation model that calculates a magnetic field in the plasma processing chamber 10. The plasma processing apparatus 1 has a fixed apparatus configuration such as the shape of the plasma processing chamber 10 or the arrangement positions of the coils 51, and also has fixed electrical characteristics. Thus, in consideration of the apparatus configuration, the plasma processing apparatus 1 may determine the magnetic field calculation model that calculates a magnetic field in the plasma processing chamber 10 from the set current value of each coil 51. For example, the plasma processing apparatus 1 determines an arithmetic expression for calculating a magnetic field in the plasma processing chamber 10 from the set current value of each coil 51. For example, the magnetic field calculation model data 224 store the arithmetic expression for calculating a magnetic field in the plasma processing chamber 10 from the set current value of each coil 51, as the magnetic field calculation model.

The controller 214 is a device that controls the information processing apparatus 200. As the controller 214, an electronic circuit such as a central processing unit (CPU) or a micro processing unit (MPU), or an integrated circuit such as an application specific integrated circuit (ASIC) or a field programmable gate array (FPGA) may be adopted. The controller 214 includes an internal memory for storing programs or data. The controller 214 reads the various programs including the prediction program stored in the storage unit 213, and executes the processes of the read programs. When the programs operate, the controller 214 functions as various processing units. For example, the controller 214 includes a calculation unit 231, a prediction unit 232, and a display control unit 233. In the present embodiment, descriptions will be made assuming that the controller 214 includes the calculation unit 231, the prediction unit 232, and the display control unit 233. However, the functions of the calculation unit 231, the prediction unit 232, and the display control unit 233 may be distributed and implemented in a plurality of controllers.

In the information processing apparatus 200, when the correlation is calculated, the process condition data 221 and the process result data 222 are prepared and stored in the storage unit 213. The process condition data 221 store a plurality of process conditions under which the plasma etching process is performed on the substrate W by the plasma processing apparatus 1. The process result data 222 store a process result of the plasma etching process on the substrate W for each process condition.

In order to generate the process condition data 221 and the process result data 222, the plasma processing apparatus 1 performs the plasma etching process on the substrate W under each of the plurality of process conditions, and measures a process result of the plasma etching process on the substrate W for each of the process conditions. For example, the plasma etching process is performed on the substrate W under each of the plurality of process conditions in which only the set current value of each coil 51 of the electromagnet 50 changes while the flow rate of the processing gas, the pressure in the plasma processing space 10s, and the RF power supplied from the power supply 30 are constant during the plasma etching process. Then, the process result of the plasma etching process on the substrate W under each of the process conditions is measured. For example, a plurality of process conditions including about 10 to about 20 patterns are generated by changing either the current value or the direction of the current that is to flow through each coil 51 of the electromagnet 50 according to a design of experiments. Then, the plasma etching process is performed on a photoresist formed on the substrate W with the set current value of each of the generated process conditions, and the distribution of etching rates on the substrate W is measured as the process result of each process condition. The substrate W is circular. Thus, the distribution of etching rates on the substrate W is symmetric in the radial direction with respect to the center of the substrate W. The distribution of etching rates is measured by measuring an etching rate at each position of the substrate W in the radial direction. For example, for each process condition, an etching rate is measured at each position of 26 points distant apart from the center of the substrate W with specific intervals in the radial direction. The etching rate may be a value obtained by standardizing a measured value. For example, the distribution of etching rates may be obtained as a distribution of values standardized by setting a baseline condition to 1.

In the process condition data 221, the plurality of process conditions performed as described above are stored. For example, in the process condition data 221, the set current value of each coil 51 is stored for each process condition. For example, in the process condition data 221, the set current value of each coil 51 is stored for each of the process conditions generated according to the design of experiments.

In the process result data 222, the process result of the plasma etching process on the substrate W is stored for each process condition. For example, in the process result data 222, data of the distribution of etching rates are stored for each process condition. For example, in the process result data 222, data of an etching rate measured at each position of the 26 points distant apart from the center of the substrate W with specific intervals in the radial direction is stored for each process condition.

The calculation unit 231 calculates the correlation between the spatial distribution values of the magnetic fields in the plasma processing chamber 10 and the process result of the plasma etching process on the substrate W, from the process condition data 221 and the process result data 222.

Figure 5:
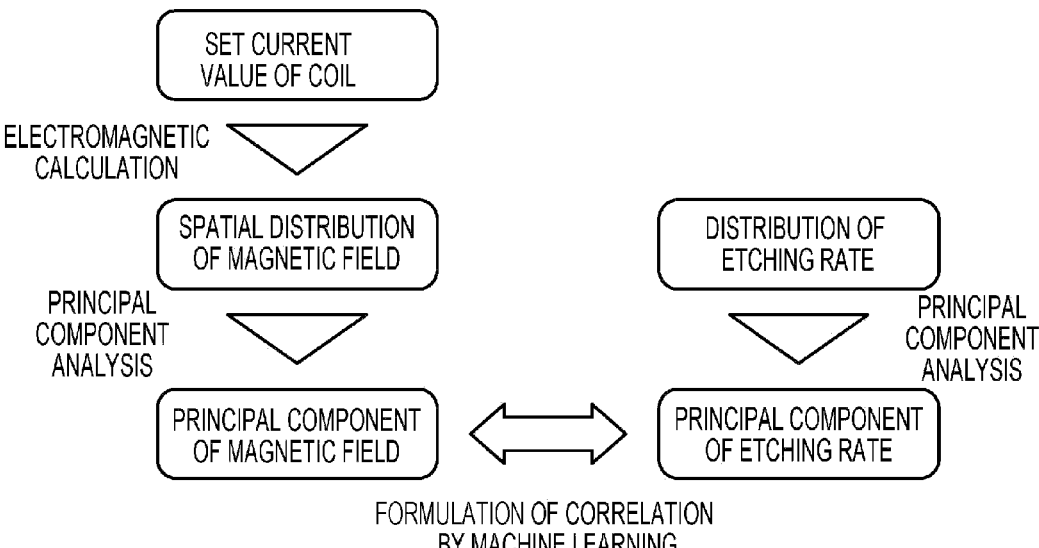
FIG. 5 is a view illustrating a correlation according to an embodiment.

FIG. 5 is a view illustrating the flow of calculating the correlation according to the embodiment.

For each process condition stored in the process result data 222, the calculation unit 231 calculates the spatial distribution of the magnetic fields in the plasma processing chamber 10 from the set current value of each coil 51, by using the magnetic field calculation model of the magnetic field calculation model data 224. For example, the calculation unit 231 calculates, for each process condition, the spatial distribution of the magnetic fields in the plasma processing chamber 10 from the set current value of each coil 51, by using the arithmetic expression of the magnetic field calculation model.

Figure 6:
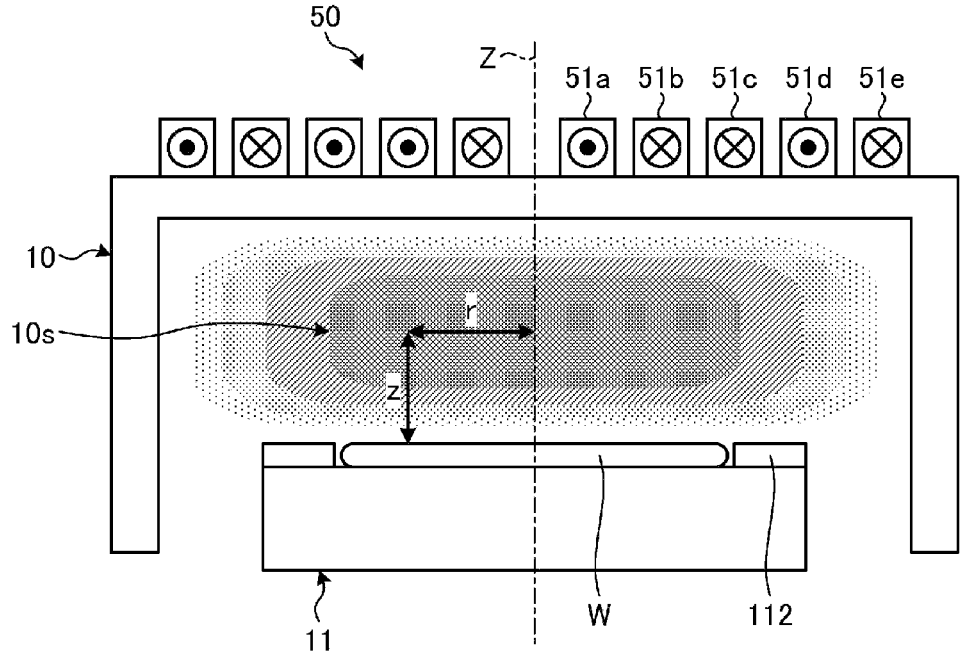
FIG. 6 is a view illustrating an example of a spatial distribution of magnetic fields in a plasma processing chamber according to an embodiment.

FIG. 6 is a view illustrating an example of the spatial distribution of the magnetic fields in the plasma processing chamber 10 according to the embodiment. FIG. 6 illustrates the schematic cross section of the plasma processing chamber 10, and schematically represents the intensity of the magnetic fields by patterns. The plasma processing chamber 10 is formed in a cylindrical shape. Thus, the spatial distribution of the magnetic fields in the plasma processing chamber 10 is symmetric in the radial direction with respect to the central axis. For each process condition, the calculation unit 231 calculates the spatial distribution of the magnetic fields in the cross section of the plasma processing chamber 10 from the set current value of each coil 51 by using the arithmetic expression of the magnetic field calculation model. For example, referring to a radius "r" from the central axis in the plasma processing chamber 10 and a height "z," the calculation unit 231 calculates the magnetic field for each position having the radius "r" and height "z" at regular intervals, thereby calculating the spatial distribution of the magnetic fields. For example, the calculation unit 231 calculates, for each process condition, the magnetic field at each position of 4,000 points in the plasma processing chamber 10 from the set current value of each coil 51 by using the arithmetic expression of the magnetic field calculation model. The magnetic field may be an absolute value of a magnetic field vector, a radial component, a vertical component, or a combination thereof, or may be a standardized value of a calculated value.

The calculation unit 231 performs a principal component analysis on the data of the spatial distribution of the magnetic fields in the plasma processing chamber 10 that include all of the plurality of process conditions, so as to calculate principal components of the magnetic fields. For example, the calculation unit 231 performs the principal component analysis on the data of the magnetic fields at the respective positions in the plasma processing chamber 10 that include all of the plurality of process conditions, so as to calculate principal components equal to or less than the number of coils 51 of the electromagnet 50. For example, five principal components including first to fifth principal components are calculated. The number of principal components to be calculated may be equal to or less than the number of coils 51 of the electromagnet 50, may be a specific number of principal components such as first to third principal components, or may dynamically change. For example, a cumulative contribution rate may be obtained by accumulating contribution rates of principal components in an order from a first principal component, and principal components may be calculated until the cumulative contribution rate exceeds a predetermined value (e.g., 80%).

Then, for each process condition, the calculation unit 231 converts the data of the spatial distribution of the magnetic fields in the plasma processing chamber 10 into score data of the principal components of the magnetic fields. For example, the calculation unit 231 converts, for each process condition, the data of the magnetic field at each position of the 4,000 points in the plasma processing chamber 10 into score data of the first to fifth principal components. As a result, the data of the spatial distribution of the magnetic fields may be greatly compressed.

Further, the calculation unit 231 performs a principal component analysis on the data of the distribution of all the etching rates that correspond to the plurality of process conditions stored in the process result data 222, so as to calculate principal components of the etching rates. For example, the calculation unit 231 performs the principal component analysis on the data of the etching rates at the respective positions in the radial direction from the center of the substrate W that correspond to the plurality of process conditions. For example, five principal components including first to fifth principal components are calculated. The number of principal components to be calculated may be equal to or more than the number of coils 51 of the electromagnet 50, may be a specific number of principal components such as first to third principal components, or may dynamically change. For example, a cumulative contribution rate may be obtained by accumulating contribution rates of principal components in an order from a first principal component, and principal components may be calculated until the cumulative contribution rate exceeds a predetermined value (e.g., 80%).

Then, for each process condition, the calculation unit 231 converts the data of the distribution of the etching rates into score data of the principal components of the etching rates. For example, for each process condition, the data of the etching rate at each position of the 26 points in the radial direction from the center of the substrate W is converted into the score data of the first to fifth principal components. As a result, the data of the distribution of the etching rates may be greatly compressed.

The calculation unit 231 calculates the correlation between the spatial distribution values of the magnetic fields in the plasma processing chamber 10 when the plasma etching process is performed on the substrate W disposed in the plasma processing chamber 10, and the process result of the plasma etching process on the substrate W. For example, the calculation unit 231 calculates the correlation between the score data of each principal component of the magnetic fields for each process condition and the score data of each principal component of the etching rates. For example, by using a multivariate analysis model, the calculation unit 231 calculates a relational expression indicating the correlation between the score data of each principal component of the magnetic fields for each process condition and the score data of each principal component of the etching rates. In this case, each principal component of the magnetic fields is used as an explanatory variable, and each principal component of the etching rates is used as an objective variable. Examples of the multivariate analysis model include a multiple regression model and a Gaussian process regression model. For example, by using the multiple regression model, the calculation unit 231 calculates a regression equation for calculating the score of each principal component of the etching rates from the score of each principal component of the magnetic fields.

The calculation unit 231 stores the data of the calculated correlation in the prediction model data 223 as a prediction model. For example, the calculation unit 231 stores the calculated regression equation in the prediction model data 223.

In the information processing apparatus 200, when a prediction is performed, the process conditions of the plasma processing apparatus 1 that performs the prediction are input as prediction conditions. The prediction conditions may be input from the input unit 212, or may be input as data from the external I/F unit 210 via a network. For example, the set current value of each coil 51 is input to the information processing apparatus 200 as a prediction condition.

The prediction unit 232 predicts the process result of the plasma etching process on the substrate W from the prediction conditions.

Figure 7:
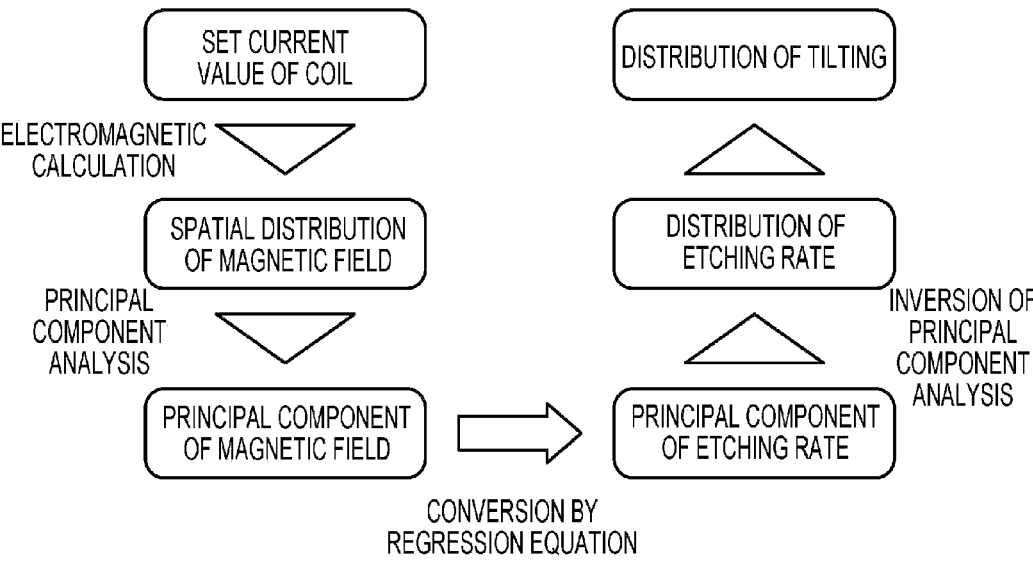
FIG. 7 is a view illustrating the flow of predicting a process result of a plasma etching process according to an embodiment.

FIG. 7 is a view illustrating the flow of predicting the process result of the plasma etching process according to the embodiment.

By using the magnetic field calculation model of the magnetic field calculation model data 224, the prediction unit 232 calculates the spatial distribution of the magnetic fields in the plasma processing chamber 10 from the process conditions set as the prediction conditions. For example, by using the arithmetic expression of the magnetic field calculation model, the prediction unit 232 calculates the spatial distribution of the magnetic fields in the plasma processing chamber 10 from the set current value of each coil 51 that is set as a prediction condition. For example, similarly to the calculation of the correlation, referring to the radius "r" from the central axis in the plasma processing chamber 10 and the height "z," the prediction unit 232 calculates the magnetic field for each position having the radius "r" and height "z" at regular intervals, thereby calculating the spatial distribution of the magnetic fields. For example, the prediction unit 232 calculates, for each process condition, the magnetic field at each position of the 4,000 points in the plasma processing chamber 10 from the set current value of each coil 51 by using the arithmetic expression of the magnetic field calculation model. The magnetic field may be a standardized value of the calculated value.

The prediction unit 232 converts the data of the calculated spatial distribution of the magnetic fields in the plasma processing chamber 10 into the score data of the principal components, by using each principal component of the magnetic fields when the correlation is calculated. For example, the prediction unit 232 converts the data of the magnetic field at each position of the 4,000 points in the plasma processing chamber 10 into the score data of the first to fifth principal components of the magnetic fields.

By using the prediction model stored in the prediction model data 223, the prediction unit 232 predicts the process result of the plasma etching process on the substrate W from the spatial distribution values of the magnetic fields in the plasma processing chamber 10. For example, by using the regression equation stored in the prediction model data 223, the prediction unit 232 calculates the score of each principal component of the etching rates from the score of each principal component of the magnetic fields. For example, the prediction unit 232 calculates scores of the first to fifth principal components of the etching rates.

The prediction unit 232 inversely converts the calculated score of each principal component of the etching rates into the data of the distribution of the etching rates. For example, the prediction unit 232 inversely converts the score of each principal component of the etching rates by using each principal component of the etching rates when the correlation is calculated, into the data of the distribution of the etching rates. For example, the prediction unit 232 converts the data of the scores of the first to fifth principal components of the etching rates into the data of the etching rates at the respective positions of the 26 points in the radial direction from the center of the substrate W.

The prediction unit 232 predicts a tilting distribution of the substrate W from the distribution of the etching rates of the substrate W. For example, the prediction unit 232 calculates a differential value by differentiating a value of an etching rate of the substrate W at each position of the substrate W in the radial direction. For example, the prediction unit 232 calculates a difference in etching rate between each position of the 26 points in the radial direction from the center of the substrate W and one radially inner position. The tilting occurs at a portion where the etching rate changes. Thus, the differential value of the etching rate corresponds to a tilting angle.

The display control unit 233 performs a display control to display the process result of the plasma etching process predicted by the prediction unit 232, on the display unit 211. For example, the display control unit 233 performs a display control to display the predicted etching rate distribution or tilting distribution on the display unit 211.

The information processing apparatus 200 may output the data of the process result of the plasma etching process predicted by the prediction unit 232 to another apparatus via the external I/F unit 210.

Figure 8:
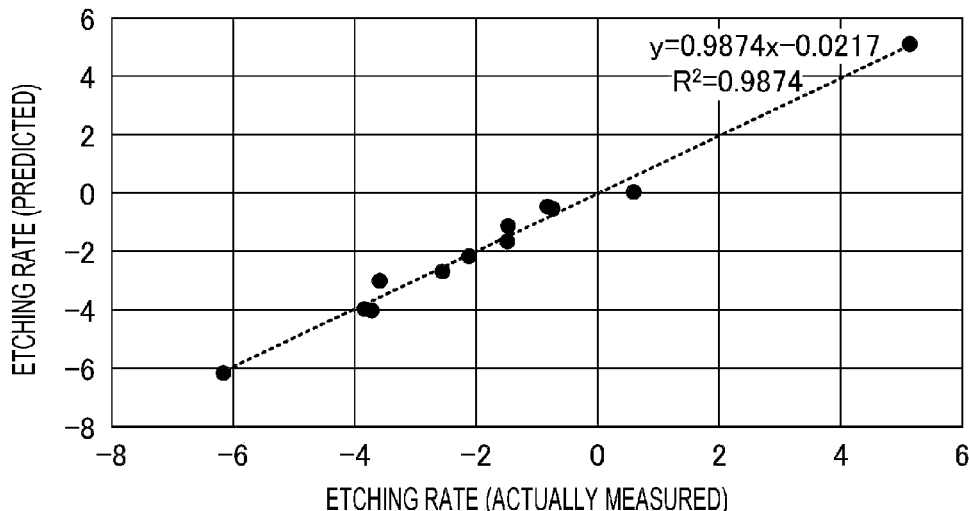
FIG. 8 is a view illustrating an example of a verification result of etching rated according to an embodiment.

Next, an example of the prediction result by the information processing apparatus 200 will be described. First, descriptions will be made on an example where a prediction result and an actual process result are verified, for the etching rate. FIG. 8 is a view illustrating an example of a verification result of the etching rates according to the embodiment. FIG. 8 illustrates the verification of a prediction result of the etching rate and an actual process result, for each process condition of the process condition data 221 used for calculating the prediction model. The horizontal axis represents standardized values of actually measured etching rates. The vertical axis represents standardized values of predicted etching rates. In FIG. 8, points are plotted at positions each having an actual etching rate on the horizontal axis and a predicted etching rate on the vertical axis, for each process condition of the process condition data 221 used for calculating the prediction model. Further, FIG. 8 illustrates a result of a correlation of an etching rate predicted as an actual etching rate of each process condition. A correlation coefficient $R^2$ has a high value of 0.9876. Thus, the information processing apparatus 200 may predict the etching rate of each process condition of the process condition data 221 with a high accuracy.

Figure 9:
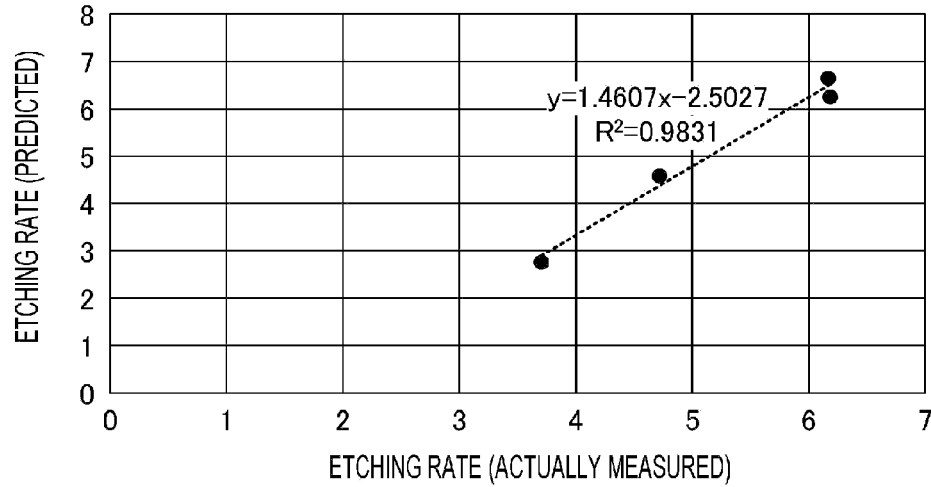
FIG. 9 is a view illustrating another example of the verification result of the etching rate according to an embodiment.

FIG. 9 is a view illustrating another example of the verification result of the etching rates according to the embodiment. FIG. 9 illustrates the verification of a prediction result of an etching rate and an actual process result, for process conditions other than the process conditions of the process condition data 221. The horizontal axis represents standardized values of actual etching rates. The vertical axis represents standardized values of predicted etching rates. In FIG. 9, points are plotted at positions each having an actual etching rate on the horizontal axis and a predicted etching rate on the vertical axis, for each process condition. FIG. 9 illustrates a result of a correlation of an etching rate predicted as an actual etching rate of each process condition. A correlation coefficient $R^2$ has a high value of 0.9831. Thus, the information processing apparatus 200 may predict the etching rate with a high accuracy, even for process conditions other than the process conditions of the process condition data 221. As a result, the information processing apparatus 200 may predict the etching rate with a high accuracy.

Figure 10:
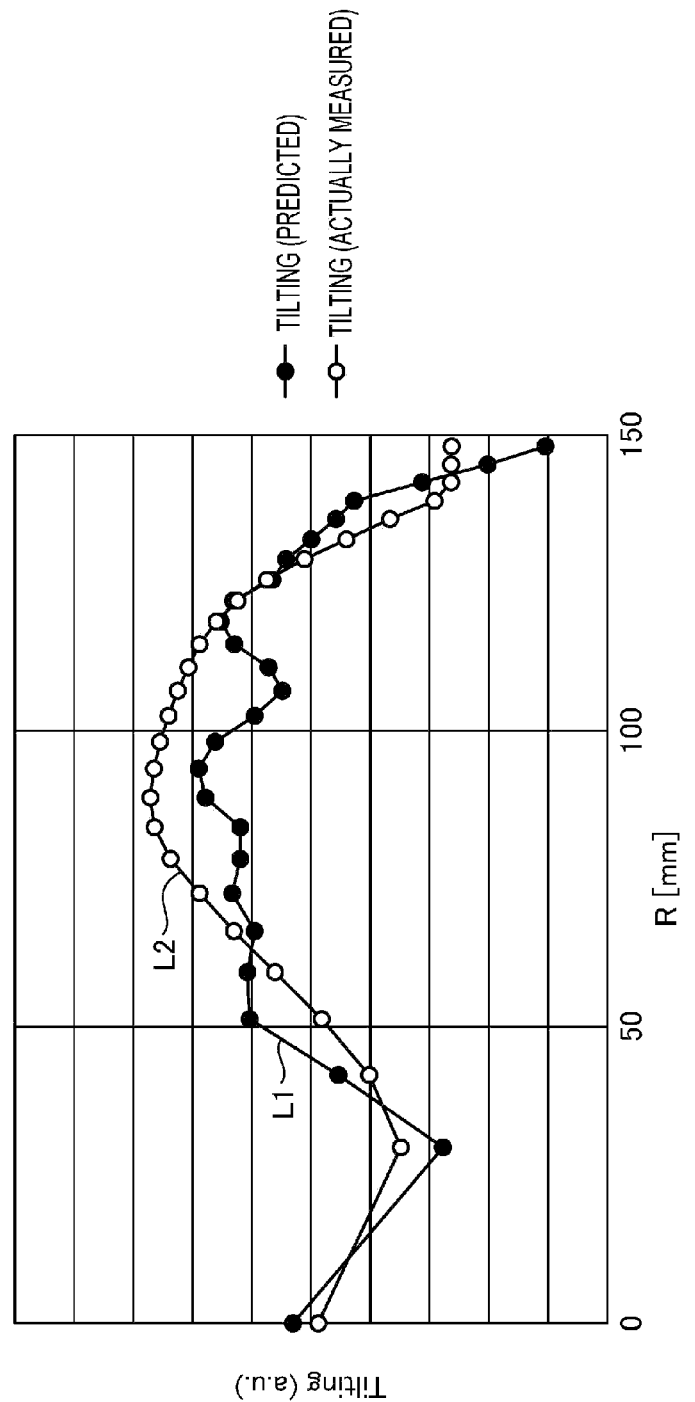
FIG. 10 is a view illustrating an example of a verification result of a tilting according to an embodiment.

Next, descriptions will be made on an example where a prediction result and an actual process result are verified, for a tilting. FIG. 10 is a view illustrating an example of a verification result of a tilting according to the embodiment. FIG. 10 illustrates a change of a tilting angle with respect to a distance R from the center of the substrate W. A line L1 represents a predicted tilting angle. A line L2 indicates an actually measured tilting angle. The lines L1 and L2 have a substantially consistent shape. Thus, the information processing apparatus 200 may predict the tilting angle with a high accuracy.

Figure 11:
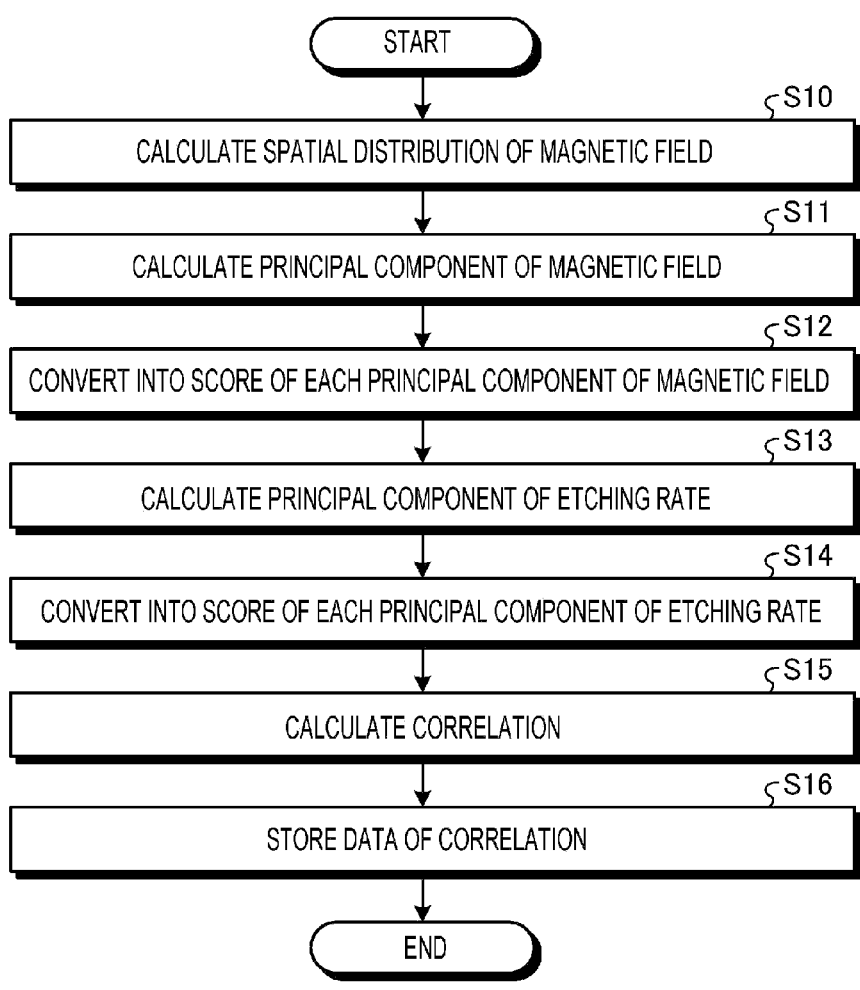
FIG. 11 is a view illustrating an example of a process procedure of a calculation process according to an embodiment.

Next, descriptions will be made on the flow of a process of a prediction method performed by the information processing apparatus 200 according to the embodiment. First, the flow of the calculation process for calculating the correlation will be described. FIG. 11 is a view illustrating an example of a procedure of the calculation process according to the embodiment. The calculation process illustrated in FIG. 11 is performed when the process condition data 221 and the process result data 222 are stored in the storage unit 213, and a predetermined process start instruction is made. FIGS. 12A to 12F are views illustrating examples of data used for the calculation process according to the embodiment.

For each of the plurality of process conditions stored in the process condition data 221, the calculation unit 231 calculates the spatial distribution of the magnetic fields in the plasma processing chamber 10 from the set current value of each coil 51 by using the magnetic field calculation model of the magnetic field calculation model data 224 (step S10). FIG. 12A illustrates the set current values of the five coils 51 in C1 to C5 as process conditions 1 to 20. For example, the calculation unit 231 calculates, for each of the process conditions 1 to 20, the magnetic field at each position of the 4,000 points in the plasma processing chamber 10 from the set current values of C1 to C5, by using the arithmetic expression of the magnetic field calculation model. FIG. 12B illustrates the data of the magnetic field at each position of the 4,000 points in the plasma processing chamber 10.

The calculation unit 231 performs the principal component analysis on the data of the spatial distribution of the magnetic fields in the plasma processing chamber 10 that include all of the plurality of process conditions, to calculate the principal components of the magnetic fields (step S11). Then, for each process condition, the calculation unit 231 converts the data of the spatial distribution of the magnetic fields in the plasma processing chamber 10 into the score data of each principal component of the magnetic fields (step S12). For example, the calculation unit 231 performs the principal component analysis on the data of the magnetic fields at the 4,000 points of the process conditions 1 to 20, to calculate the first to fifth principal components of the magnetic fields. Then, the calculation unit 231 converts the data of the magnetic fields at the 4,000 points of the process conditions 1 to 20 into the score data of the first to fifth principal components. FIG. 12C illustrates the score data of the first to fifth principal components for the process conditions 1 to 20.

Further, the calculation unit 231 performs the principal component analysis on the data of the distribution of the etching rates that include all of the plurality of process conditions stored in the process result data 222, to calculate the principal components of the etching rates (step S13).

Then, for each process condition, the calculation unit 231 converts the data of the distribution of the etching rates into the score data of each principal component of the etching rates (step S14). FIG. 12D illustrates the etching rates at substrate positions 1 to 26 of the 26 points in the radial direction from the center of the substrate W, for the process conditions 1 to 20. For example, the calculation unit 231 performs the principal component analysis on the data of the etching rates at the substrate positions 1 to 26 of the process conditions 1 to 20, to calculate the first to fifth principal components of the etching rates. Then, the calculation unit 231 converts the data of the etching rates at the substrate positions 1 to 26 of the process conditions 1 to 20 into score data of the first to fifth principal components. FIG. 12E illustrates the score data of the first to fifth principal components for the process conditions 1 to 20.

The calculation unit 231 calculates the correlation between the spatial distribution values of the magnetic fields in the plasma processing chamber 10 when the plasma etching process is performed on the substrate W disposed in the plasma processing chamber 10, and the process result of the plasma etching process on the substrate W (step S15). For example, the calculation unit 231 calculates the regression equation representing the correlation between the score data of each principal component of the magnetic fields for each process condition, and the score data of each principal component of the etching rates. For example, as illustrated in FIG. 12F, the calculation unit 231 calculates the regression model representing the correlation in which the score data of the first to fifth principal components of the magnetic fields for the process conditions 1 to 20 are explanatory variables, and the scores of the first to fifth principal components of the etching rates for the process conditions 1 to 20 are objective variables.

The calculation unit 231 stores the data of the calculated correlation in the prediction model data 223 as the prediction model. For example, the calculation unit 231 stores the calculated regression equation in the prediction model data 223 (step S16), and terminates the process.

In the calculation process, the sequence of steps S10 to S12 and the sequence of steps S13 and S14 may be reversed, or the steps may performed in parallel.

Figure 13:
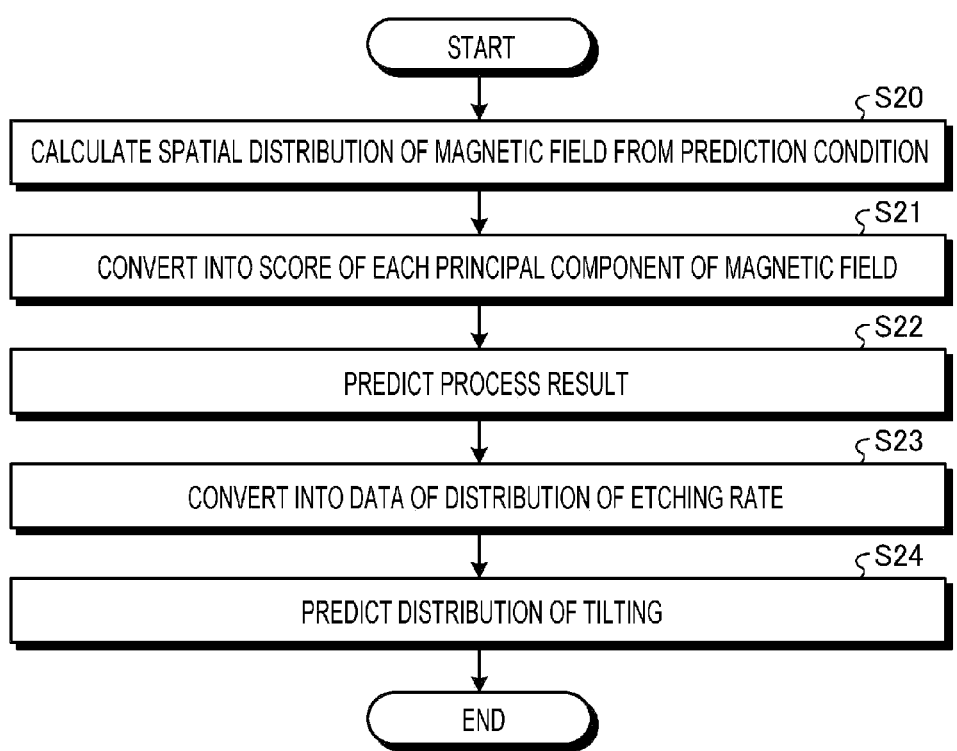
FIG. 13 is a view illustrating an example of a process procedure of a prediction process according to an embodiment.

Next, descriptions will be made on the flow of the prediction process for predicting the process result of the plasma etching process on the substrate W. FIG. 13 is a view illustrating an example of a process procedure of the prediction process according to the embodiment. The prediction process illustrated in FIG. 13 is performed when the process conditions set as the prediction conditions are input, and a predetermined process start instruction is made. FIGS. 14A to 14E are views illustrating examples of the data used for the prediction process according to the embodiment.

By using the magnetic field calculation model of the magnetic field calculation model data 224, the prediction unit 232 calculates the spatial distribution of the magnetic fields in the plasma processing chamber 10 from the process conditions set as the prediction conditions (step S20). The prediction unit 232 converts the data of the calculated spatial distribution of the magnetic fields in the plasma processing chamber 10 into the score data of each principal component of the magnetic fields by using the principal components of the magnetic fields when the correlation is calculated (step S21). FIG. 14A illustrates the set current values of the five coils 51 in C1 to C5 as the process conditions set as the prediction conditions. For example, by using the arithmetic expression of the magnetic field calculation model, the prediction unit 232 calculates the magnetic field at each position of the 4,000 points in the plasma processing chamber 10 from the set current values of C1 to C5 of the process conditions set as the prediction conditions. FIG. 14B illustrates the data of the magnetic field at each position of the 4,000 points in the plasma processing chamber 10. By using the first to fifth principal components of the magnetic fields, the prediction unit 232 converts the data of the magnetic fields of the 4,000 points into the score data of the first to fifth principal components. FIG. 14C illustrates the score data of the first principal components of the magnetic fields.

By using the prediction model stored in the prediction model data 223, the prediction unit 232 predicts the process result of the plasma etching process on the substrate W, from the spatial distribution values of the magnetic fields in the plasma processing chamber 10 (step S22). For example, by using the regression equation stored in the prediction model data 223, the prediction unit 232 calculates the score of each principal component of the etching rates from the score of each principal component of the magnetic fields. For example, by using the regression model representing the correlation, the prediction unit 232 calculates the score data of the first to fifth principal components of the etching rates from the score data of the first to fifth principal components of the etching rates. FIG. 14D illustrates the score data of the first to fifth principal components of the etching rates.

The prediction unit 232 converts the calculated score of each principal component of the etching rates into the data of the distribution of the etching rates by the inversion of the principal component analysis (step S23). For example, the prediction unit 232 performs the inversion of the principal component analysis of the etching rates calculated in step S13, on the scores of the first to fifth principal components of the etching rates, so as to calculate prediction values of the etching rates of the substrate positions 1 to 26. FIG. 14E illustrates the prediction values of the etching rates of the substrate positions 1 to 26.

The prediction unit 232 predicts the tilting distribution of the substrate W from the distribution of the etching rates of the substrate W (step S24), and terminates the process. For example, the prediction unit 232 calculates the differential value by differentiating the value of the etching rate of the substrate W at each position of the substrate W in the radial direction as the tilting distribution.

In this way, the information processing apparatus 200 may predict the process result of the plasma etching process. For example, the information processing apparatus 200 may predict the distribution of the etching rates of the substrate W when the plasma processing apparatus 1 performs the plasma etching process on the substrate W under the prediction conditions. Further, the information processing apparatus 200 may predict the tilting distribution of the substrate W when the plasma processing apparatus 1 performs the plasma etching process on the substrate W under the prediction conditions.

In the embodiment described above, the correlation is calculated between the score data of each principal component of the magnetic fields for each process condition and the score data of each principal component of the etching rates. However, the present disclosure is not limited thereto. The calculation unit 231 may calculate a correlation between the data of the spatial distribution of the magnetic fields and the data of the distribution of the etching rates for each process condition. For example, the calculation unit 231 may calculate a correlation between the data of the magnetic field at each position of the 4,000 points in the plasma processing chamber 10 for each process condition and the data of the etching rate at each position of the 26 points in the radial direction from the center of the substrate W, and calculate the regression equation. In this case, the spatial distribution of the magnetic fields (e.g., the 4,000 points) is an explanatory variable, and the etching rates (e.g., the 26 points) are objective variables. In this case, by using the calculated regression equation, the prediction unit 232 may directly calculate the data of the distribution of the etching rates from the data of the spatial distribution of the magnetic fields in the plasma processing chamber 10.

In the embodiment described above, the information processing apparatus 200 calculates the spatial distribution of the magnetic fields in the plasma processing chamber 10 from the process conditions, by using the magnetic field calculation model of the magnetic field calculation model data 224. However, the present disclosure is not limited thereto. The data of the spatial distribution of the magnetic fields in the plasma processing chamber 10 may be calculated by another apparatus, and may be transmitted to the information processing apparatus 200. The calculation unit 231 may calculate the correlation by using the data of the spatial distribution of the magnetic fields in the plasma processing chamber 10 that have been received from another apparatus.

In the embodiment described above, the information processing apparatus 200 performs the principal component analysis on the data of the spatial distribution of the magnetic fields and the data of the distribution of the etching rates, which include all of the plurality of process conditions. However, the present disclosure is not limited thereto. Another apparatus may perform the principal component analysis. For example, the score data of each principal component of the magnetic fields for each process condition may be calculated by another apparatus, and may be transmitted to the information processing apparatus 200. Further, the score data of each principal component of the etching rates for each process condition may be calculated by another apparatus, and may be transmitted to the information process apparatus 200. The calculation unit 231 may calculate the correlation by using the score data of each principal component of the magnetic fields for each process condition and the score data of each principal component of the etching rates that have been received from another apparatus.

In the embodiment described above, in the prediction, the distribution of the etching rates is calculated, and the tilting distribution is calculated from the distribution of the etching rates. However, the present disclosure is not limited thereto. The prediction unit 232 may directly calculate the tilting distribution by using the prediction model. In this case, for example, the process condition data 221 stores data of a tilting distribution as the process result of the plasma etching process for each process condition. The tilting may be obtained by measuring the inclination of a hole of the substrate W subjected to the plasma etching process through an X-ray measurement technique. For example, the distribution of inclination of a hole of the substrate W in the substrate plane is measured by an X-ray measurement device, and data of the tilting distribution of the substrate W is stored in the process condition data 221. The calculation unit 231 calculates a correlation between the spatial distribution values of the magnetic fields in the plasma processing chamber 10 when the plasma etching process is performed on the substrate W disposed in the plasma processing chamber 10, and the tilting distribution of the substrate W. Accordingly, the prediction unit 232 may directly calculate the tilting distribution of the substrate W from the prediction conditions based on the calculated correlation.

Figure 15:
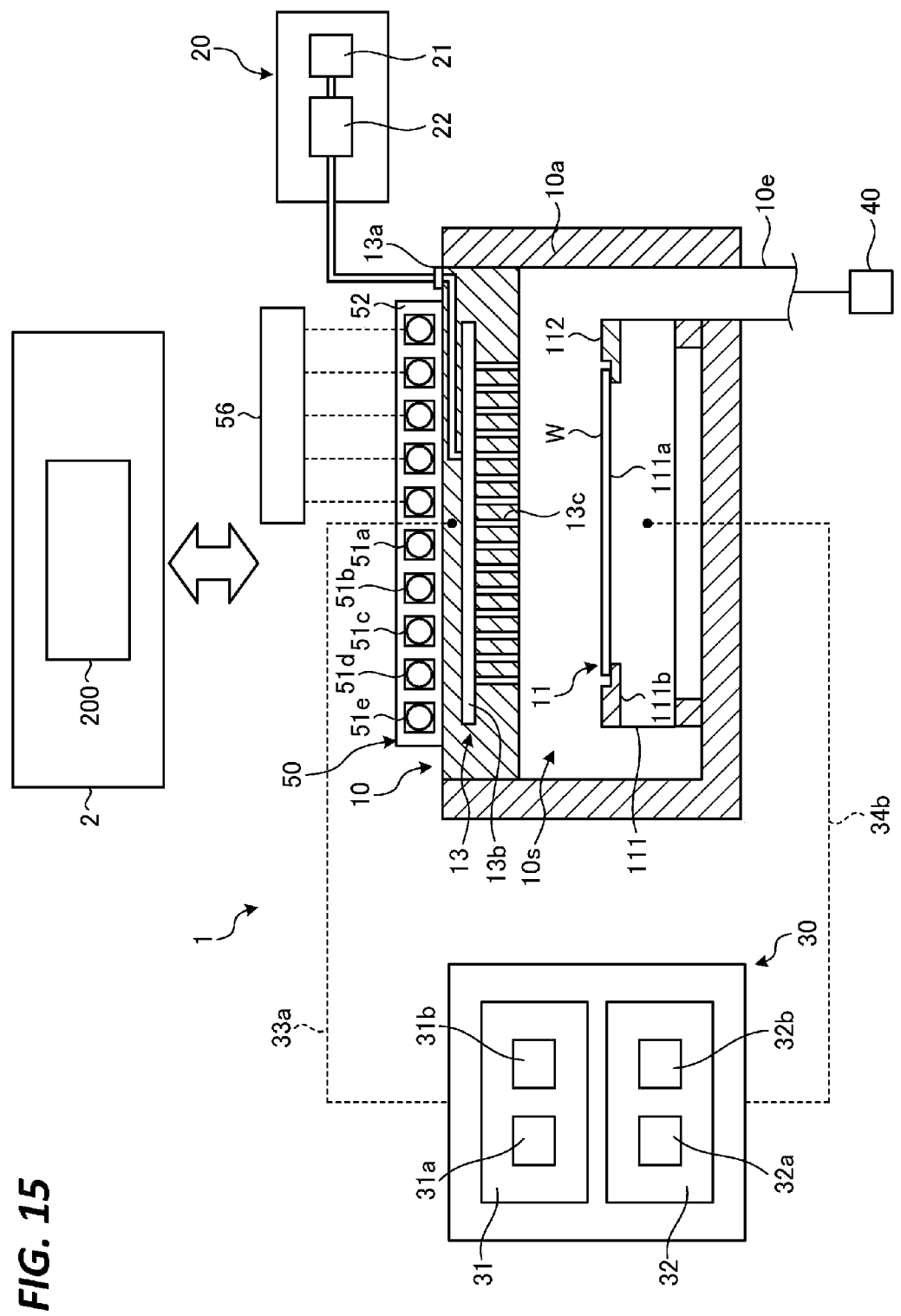
FIG. 15 is a view illustrating another example of the schematic configuration of the plasma processing system according to an embodiment.

In the embodiment described above, the information processing apparatus 200 separate from the plasma processing system predicts the process result of the plasma etching process. However, the present disclosure is not limited thereto. The plasma processing system may be configured to include the information processing apparatus 200. The plasma processing system may operate the information processing apparatus 200 together with the control unit 2. Alternatively, the control unit 2 and the information processing apparatus 200 may be integrated. For example, the control unit 2 may include the functions of the calculation unit 231 and the prediction unit 232 described above. FIG. 15 is a view illustrating another example of the schematic configuration of the plasma processing system according to the embodiment. FIG. 15 illustrates a case where the control unit 2 and the information processing apparatus 200 are integrated, and the control unit 2 includes the information processing apparatus 200. In this case, the control unit 2 of the plasma processing system may predict the process result of the plasma etching process.

The plasma etching process on the substrate W may include a plurality of steps. For example, the plasma etching process may be a cyclic etching in which the RF power is repeatedly applied in a pulse form. Further, in the plasma etching process, a plurality of etching processes may be sequentially performed. The information processing apparatus 200 may collectively predict process results of the plurality of steps. Alternatively, the information processing apparatus 200 may predict a process result of each process, and may integrate the process results of the respective processes so as to predict a final process result.

In the present embodiment, the spatial distribution values of the magnetic fields are calculated from the set current values of the coils 51, and the correlation between the calculated spatial distribution values of the magnetic fields and the process result of the plasma etching process on the substrate W is calculated. The spatial distribution of the magnetic fields may be calculated from the set current values of the coils 51. Thus, it may be conceivable to perform the prediction by calculating the correlation between the set current values of the coils 51 and the process result of the plasma etching process on the substrate W. However, when the explanatory variables of the relational expression representing the correlation are changed from the set current values to the magnetic fields, a prediction error may be reduced.

FIG. 16 is a view illustrating an example of the prediction error according to the embodiment. The horizontal fields represent a case where the explanatory variables of the relational expression representing the correlation are the set current values of the coils 51, a case where the explanatory variables are the spatial distribution of the magnetic fields, and a case where the explanatory variables are the principal components of the spatial distribution of the magnetic fields. The vertical fields represent a case where the objective variables of the relational expression representing the correlation are the etching rates, and a case where the objective variables are the principal components of the etching rates. FIG. 16 illustrates a prediction error in the relational expression indicating the correlation with each explanatory variable and each objective variable. The prediction error is represented by standardizing the minimum value to 1. When the explanatory variables are the spatial distribution of the magnetic fields or the principal components of the spatial distribution of the magnetic fields, and the objective variables are the etching rates, the prediction error is the smallest with 1, which implements the high accuracy. Even when the explanatory variables are the spatial distribution of the magnetic fields or the principal components of the spatial distribution of the magnetic fields, and the objective variables are the principal components of the etching rates, the prediction error is sufficiently small, so that the high accuracy may be implemented. Meanwhile, when the explanatory variables are the set current values of the coils 51, the prediction error is about 1.16, which increases by about 16%. The reason for the increase may be considered as follows. The magnetic field directly affects plasma in the plasma processing chamber 10. Thus, it is understood that the accuracy is further improved when the magnetic fields are directly used as the objective variables, rather than when the set current values of the coils 51 for indirectly calculating the magnetic fields are used as the objective variables.

As described above, the prediction method according to the embodiment includes the calculation process (e.g., steps S10 to S15) and the prediction process (e.g., steps S20 to S24). In the calculation process, the correlation is calculated between the spatial distribution values of the magnetic fields in the plasma processing chamber 10 when the plasma etching process is performed on the substrate W disposed in the plasma processing chamber 10, and the process result of the plasma etching process on the substrate W. In the prediction process, the process result of the plasma etching process on the substrate W is predicted from the spatial distribution values of the magnetic fields in the plasma processing chamber 10 based on the calculated correlation. Therefore, the prediction method according to the embodiment may predict the process result of the plasma etching process.

The spatial distribution values of the magnetic fields are calculated from the set current values of the electromagnet 50 provided in the plasma processing chamber 10. Thus, the prediction method according to the embodiment may predict the process result of the plasma etching process from the set current values of the electromagnet 50.

The spatial distribution values of the magnetic fields are the scores of the principal components (e.g., principal component scores) obtained by the principal component analysis. Thus, the prediction method according to the embodiment may reduce the data amount of the spatial distribution values of the magnetic fields, so that the computing load may be reduced when the correlation is calculated or when the process result is predicted.

The number of principal components is equal to or less than the number of coils 51 of the electromagnet 50 provided in the plasma processing chamber 10. Thus, the prediction method according to the embodiment may reduce the data amount of the spatial distribution values of the magnetic fields.

The process result is the distribution of the inclination of a hole formed by the plasma etching process within the substrate plane. Thus, the prediction method according to the embodiment may predict the tilting distribution in the substrate plane.

The distribution of the inclination of a hole in the substrate plane is measured by the X-ray measurement technique. Thus, even for a fine hole formed in the substrate W, the distribution of the inclination of a hole in the substrate plane may be measured.

The process result is the distribution of the etching rates of the plasma etching process in the substrate plane. The prediction process predicts the distribution of the etching rates in the substrate plane, and differentiates the predicted distribution of the etching rates in the substrate plane with the distance from the center of the substrate W, thereby predicting the distribution of the inclination of a hole formed by the plasma etching process in the substrate plane. Thus, the prediction method according to the embodiment may predict the tilting distribution in the substrate plane, even when the distribution of the etching rates in the substrate plane is used as the process result.

The correlation is calculated by using the multivariate analysis model. The multivariate analysis model is the multiple regression model or the Gaussian process regression model. Thus, the prediction method according to the embodiment may accurately obtain the correlation between the spatial distribution values of the magnetic fields in the plasma processing chamber 10 and the process result.

For example, in the embodiment described above, the plasma process is performed on a semiconductor wafer as the substrate W. However, the present disclosure is not limited thereto. The substrate W is not specifically limited.

According to the present disclosure, it is possible to predict a process result of a plasma etching process.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A prediction method comprising:
calculating a correlation between a spatial distribution value of a magnetic field in a chamber when a plasma etching process is performed on a substrate disposed in the chamber, and a process result of the plasma etching process on the substrate;
predicting the process result of the plasma etching process on the substrate from the spatial distribution value of the magnetic field in the chamber based on the calculated correlation; and
adjusting a current of an electromagnet provided in the chamber based on the predicted process result to control a plasma density distribution of a plasma etching process,
wherein the process result is a distribution of an inclination of a hole formed by the plasma etching process in a substrate plane, and
the spatial distribution value of the magnetic field is a principal component score of a principal component obtained by a principal component analysis.

2. The prediction method according to claim 1, wherein the spatial distribution value of the magnetic field is calculated from a set current value of an electromagnet provided in the chamber.

3. The prediction method according to claim 2, wherein a number of the principal component is equal to or less than a number of coils of the electromagnet provided in the chamber.

4. The prediction method according to claim 1, wherein the distribution of the inclination of the hole in the substrate plane is measured by an X-ray measurement technique.

5. The prediction method according to claim 3, wherein the process result is a distribution of an etching rate of the plasma etching process in a substrate plane, and
the predicting predicts the distribution of the etching rate in the substrate plane, and differentiates the predicted distribution of the etching rate in the substrate plane with a distance from a center of the substrate, thereby predicting the distribution of the inclination of the hole formed by the plasma etching process.

6. The prediction method according to claim 5, wherein the correlation is calculated by using a multivariate analysis model.

7. The prediction method according to claim 6, wherein the multivariate analysis model is a multiple regression model or a Gaussian process regression model.

8. The prediction method according to claim 5, wherein the plasma etching process on the substrate includes a plurality of steps.

9. The prediction method according to claim 1, wherein the principal component analysis is performed on data of the spatial distribution of the magnetic fields in the plasma processing chamber that include a plurality of process conditions, so as to calculate principal components of the magnetic fields.

10. The prediction method according to claim 9, wherein the principal component analysis is performed on data of the magnetic fields at respective positions in the chamber that include all of the plurality of process conditions, so as to calculate principal components equal to or less than the number of coils of the electromagnet.

11. The prediction method according to claim 10, wherein the data of the spatial distribution of the magnetic fields in the chamber includes magnetic fields at each position of 4,000 points in the chamber.

12. An information processing apparatus comprising:

a calculation circuit configured to calculate a correlation between a spatial distribution value of a magnetic field in a chamber when a plasma etching process is performed on a substrate disposed in the chamber and a process result of the plasma etching process on the substrate;

a prediction circuit configured to predict the process result of the plasma etching process from the spatial distribution value of the magnetic field in the chamber, based on the calculated correlation; and a control circuit configured to adjust a current of an electromagnet provided in the chamber based on the predicted process result to control a plasma density distribution of a plasma etching process, wherein the process result is the distribution of the inclination of a hole formed by the plasma etching process in a substrate plane, and the spatial distribution value of the magnetic field is a principal component score of a principal component obtained by a principal component analysis.

* * * * *